United States Patent [19]

Wine

[11] 4,158,816

[45] Jun. 19, 1979

[54] MEMORY TYPE TUNING SYSTEM WITH PROVISIONS FOR SKIPPING NONPREFERRED TUNING POSITIONS

[75] Inventor: Charles M. Wine, Princeton, N.J.

[73] Assignee: RCA Corporation, New York, N.Y.

[21] Appl. No.: 863,918

[22] Filed: Dec. 23, 1977

[51] Int. Cl.² .............................................. H04B 1/26
[52] U.S. Cl. ................................... 325/464; 325/455
[58] Field of Search ............... 325/464, 465, 466, 467, 325/468, 452, 455, 457, 459; 324/77 C, 77 CS; 334/14, 15

[56] References Cited

U.S. PATENT DOCUMENTS

| 4,005,368 | 1/1977 | Tanaka | 325/464 |
| 4,024,476 | 5/1977 | Briggs | 325/464 |
| 4,031,474 | 7/1977 | Ehni | 325/455 |

FOREIGN PATENT DOCUMENTS 50-16044  2/1975  Japan.

OTHER PUBLICATIONS

Magnavox Service Manual, 703777 Videomatic Touch Tune Assembly, Manual No. 7353.

Primary Examiner—Robert L. Griffin
Assistant Examiner—Tommy P. Chin
Attorney, Agent, or Firm—Eugene M. Whitacre; Paul J. Rasmussen; Peter M. Emanuel

[57] ABSTRACT

A tuning system of a television receiver includes a memory with a plurality of memory locations for storing tuning information associated with various channels a viewer may select. Each memory location includes a display portion for storing a binary word representing, in BCD format, information for displaying the channel number of an associated channel and a tuning voltage portion for storing a binary word representing information for generating the appropriate tuning voltage for the associated channel. When it is desired to have a channel skipped over during the normal channel selection mode of operation of the tuning system, in response to viewer control, an input complementor complements each of the binary signals of the binary word stored in the display portion of the associated memory location to form the "1s" complement of the binary word representing the channel number of the channel and thereby identify the associated channel as a nonpreferred channel. Since the "1s" complements of the binary words representing channel numbers between 2 and 83 represent illegal channel numbers, (i.e., channel numbers not between 2 and 83), an illegal channel number decoder is used to cause memory locations containing binary signals representing illegal channel number to be skipped during the normal channel selection mode of operation of the tuning system. When it is desired to reinstate a previously skipped channel, an output complementor, in response to viewer control, recomplements each binary signal of the previously complemented binary word representing the associated channel number.

4 Claims, 1 Drawing Figure

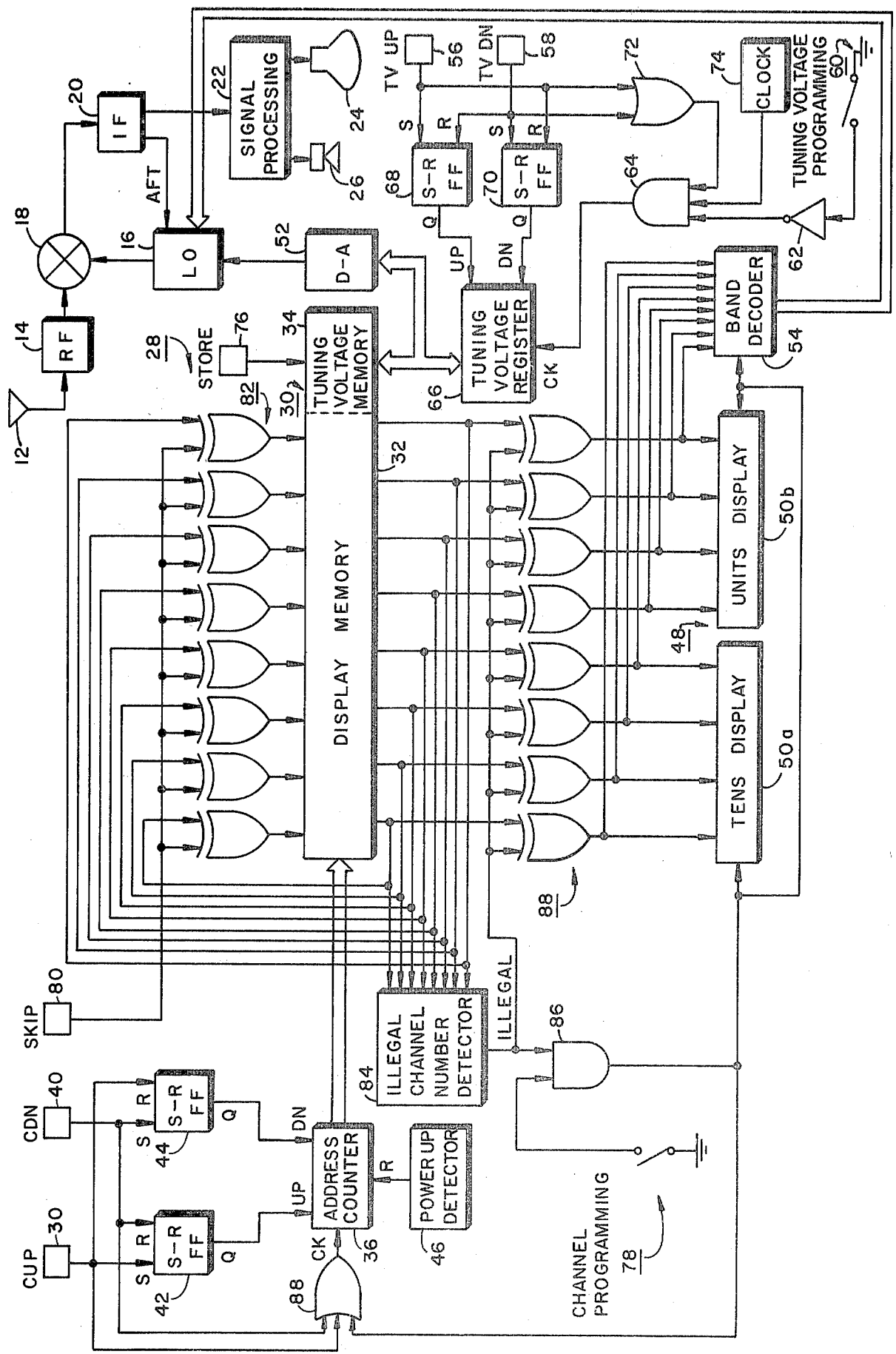

MEMORY TYPE TUNING SYSTEM WITH PROVISIONS FOR SKIPPING NONPREFERRED TUNING POSITIONS

BACKGROUND OF THE INVENTION

The present invention relates to the field of tuning systems including a memory for storing tuning information for television receivers and the like.

Recently, a number of tuning systems including a memory having a plurality of memory locations for storing tuning information in binary format for various channels a viewer may select have been proposed. In some of these tuning systems, the memory includes enough memory locations for each of the channels (e.g., channels 2 through 83 in the United States) assigned to the television broadcast band. Typically, in these tuning systems, the memory is preprogrammed by the manufacturer to store the appropriate tuning information for each of the available channels. Thus, such systems have the advantage that they do not require a user normally unfamiliar with the programming of electronic equipment to program the memory in order to set up the tuning system. Unfortunately, because of the size of the memory utilized in these tuning systems, they are relatively expensive. Therefore, in other tuning systems including a memory, for purposes of economy, the memory only includes a limited number (e.g., 16 to 20) memory locations provided for storing tuning information for a respective number of channels. Since the manufacturer of such tuning systems will not, in general, know the channels which are available in users viewing localities, users will have to perform at least some programming. However, to reduce the amount of user programming required for such tuning systems, some of the memory locations may be preprogrammed by the manufacturer to store information for a certain group of most often available channels (e.g., VHF channels 2-13 in the United States).

At any rate, in a tuning system including a memory, whether all or just some of the memory locations are preprogrammed, it is desirable that the tuning system include provisions for automatically skipping channels which are not preferred by a user because of their reception characteristics or program contents. To this end, some tuning systems having a memory for storing tuning information include a separate memory or memory portion with memory locations associated with respective memory locations for storing tuning information for storing a binary signal having a predetermined binary state to identify when the corresponding memory location for storing tuning information should be skipped. Since the number of memory locations in the channel skipping memory portion is equal to the number of memory locations for storing tuning information, such provisions tend to increase the cost of the tuning system.

Channel skipping provisions may also include apparatus for storing binary signals all having the same predetermined states (i.e., either all "1s" or "0s") in the memory locations corresponding to nonpreferred channels in place of the binary signals representing tuning information thereby obviating the need for a separate channel skipping memory or memory portion. Unfortunately, in such systems, the previously stored tuning information for the nonpreferred channels is eradicated and, as a result, if a user wishes to reinstate a skipped channel when, for example, he moves to a new locality where the reception quality and program content of the skipped channel are acceptable, he must reprogram the tuning information for the skipped channels.

In summary, then, in a tuning system containing a memory having a plurality of memory locations for storing tuning information, it is desirable that apparatus for skipping memory locations containing tuning information for nonpreferred channels be provided and that such apparatus be capable of utilizing a portion of the existing memory for normally storing tuning information to store information for identifying nonpreferred channels, thereby obviating the need for an additional memory or memory portion and operating without permanently eradicating tuning information previously stored in the portion of the memory utilized for identifying nonpreferred channels thereby allowing for the recall of the previously stored information.

SUMMARY OF THE PRESENT INVENTION

A tuning system having a memory with a plurality of memory locations for storing binary words normally representing channel numbers in a specified range, e.g., between 2 and 83 in the United States, of associated channels and channel selection means for locating the memory location associated with a channel selected by a user, includes input means for selectively complementing each of the binary signals of the binary word stored in a memory location and detector means for generating an illegal signal for causing the channel selection means to locate the memory location for another channel when the binary signals stored in a memory location represents a channel number not in the specified range.

BRIEF DESCRIPTION OF THE DRAWING

The sole FIGURE of the drawing shows in block diagram form a television receiver including a tuning system having nonpreferred channel skipping apparatus constructed in accordance with the present invention.

DETAILED DESCRIPTION OF THE DRAWING

In the television receiver of the FIGURE, radio frequency (RF) signals received by an antenna 12 are amplified and otherwise processed by an RF input unit 14 and thereafter combined with a local oscillator signal developed by a local oscillator 16 by a mixer 18 to form an intermediate frequency (IF) signal. The frequency of the local oscillator signal is controlled by a tuning system 28 in accordance with the channel presently selected by a user. The IF signal is filtered and otherwise processed in an IF unit 20 and thereafter coupled to a signal processing unit 22 where signals representing synchronization, luminance, color and sound information are derived therefrom. An image is developed by a picture tube 24 in response to the signals representing synchronization, luminance and color information. An audio response is developed by a speaker 26 in response to the signals representing sound information. IF unit 20 also generates an AFT (Automatic Fine Tuning) signal which is coupled to local oscillator 16 to correct for frequency deviations between the IF signal and a standard IF frequency, e.g., 45.75 MHz in the United States, which may arise in response to component value changes within tuning system 28.

The frequency determining element of local oscillator 16 includes at least one varactor diode which is reverse biased by a DC tuning voltage to exhibit a capacitance determined by the magnitude of the tuning voltage. Local oscillator 16 typically includes several varactor diodes corresponding to the various bands in which a selected channel may reside. For example, in the United States where channels 2 through 83 are partitioned into three bands, local oscillator 16 may include a varactor diode arrangement for the low VHF (VL) band including channels 2–6, another varactor diode arrangement for the high VHF (VH) band including channels 7–13 and still another varactor diode arrangement for the UHF (U) band including channels 14–83.

The tuning voltage and bandswitching signals for local oscillator 16 are derived by a tuning system 28 including a nonvolatile memory 30 having memory locations for storing binary signals representing tuning information for all of the channels, e.g., 2 through 83 in the United States in the television broadcast range. Each memory location has a display portion 32 for storing a binary word consisting of a first group of four binary signals arranged in BCD (Binary Coded Decimal) format to represent the tens decimal digit of the channel number of the associated channel and a second group of four binary signals arranged in BCD format to represent the units decimal digit of the associated channel. Each memory location also includes a tuning voltage portion 34 for storing a binary word representing the appropriate tuning voltage for local oscillator 16 for the associated channel. Memory 30 is programmed by the manufacturer of the receiver so that the channel number and tuning voltage information for consecutively numbered channels are stored in consecutive memory locations.

Each memory location has an address defining its location within memory 30. An address counter 36 generates binary signals representing consecutive addresses in response to a user's operation of a CUP (Channel UP) push button 38 or a CDN (Channel DowN) push button 40 to select a channel. When a user depresses CUP push button 38 a set-reset flip-flop 42 is set, i.e., a binary "1" is generated at its Q output, and address counter 36 is enabled to count in increasing order. Similarly, when a user depresses CDN push button 40, a set-reset flip-flop 44 is set and address counter 36 is thereby enabled to count in decreasing order. A power up detector 46 senses when the power supply voltage of the receiver receives a predetermined level and resets the contents of address counter 36 to a predetermined address so that a particular memory location is automatically addressed when the receiver is turned on.

When a memory location of memory 30 is addressed, the binary word representing the channel number of the associated channel stored in display memory portion 32 of the addressed memory location is coupled to a channel number display unit 48, consisting of a tens display position 50a and a units display position 50b. The binary word representing the channel number is also coupled to a band decoder 54 which, in response, generates a bandswitching signal corresponding to the band, VL, VH or U, in which the selected channel resides to control the oscillation range of local oscillator 16. The binary word stored in tuning voltage memory portion 34 of the addressed memory location is coupled to a digital-to-analog converter 52 which converts it into a DC tuning voltage for setting the frequency of local oscillator 16 to the particular frequency for the selected channel.

Although, as was previously noted above, memory 30 is intended to be preprogrammed by the manufacturer, because of the particular tuning characteristics associated with the varactor diodes included in the local oscillator 16 or because of component value changes within digital-to-analog converter 52 and local oscillator 16, it may be necessary for the words stored in tuning voltage memory 34 of a memory location corresponding to a selected channel to be updated by a user. For this purpose, a TVUP (Tuning Voltage UP) push button 56 and a TVDN (Tuning Voltage DowN) push button 58 are provided to be used in conjunction with a tuning voltage programming switch 60. When the tuning voltage for a particular selected channel is to be updated, tuning voltage programming switch 60 is closed. As a result, a binary "1" generated by an "inverter" 62 is coupled to one input of an "and" gate 64. Thereafter, when TVUP push button 56 is depressed, a set-reset flip-flop 68 is set and a tuning voltage register 66 is enabled to count in increasing order. Similarly, when TVDN peak button 58 is depressed, a set-reset flip-flop 70 is set and tuning voltage register 66 is enabled to count in decreasing order. In addition, whenever either TVUP push button 56 or TVDN push button 58 is depressed and an enabling signal is coupled through an "or" gate 72 to an input of an "and" gate 64 thereby permitting clock pulses generated by a clock circuit 74 to be coupled to the clock input of tuning voltage register 66. In response, the contents of tuning voltage register 66 and the resulting DC tuning voltage generated by the digital-to-analog converter 52 are changed. When the desired picture and audio response are obtained, the user ceases operating push buttons 56 and 58 and presses a STORE push button 76 to store the contents of tuning voltage register 66 in tuning voltage memory 34 of the presently addressed memory location corresponding to the selected channel.

As was earlier mentioned, a user may desire that a particular channel be skipped over during the channel selection mode of operation of tuning system 28 because of its program content or reception quality. In tuning system 28, a nonpreferred channel is identified by a binary word representing an illegal channel number, i.e., a channel number not in the group of broadcast channel numbers between 2 and 83, stored in display memory portion 32 of the memory location associated with the channel. The binary word representing the illegal channel number for identifying a nonpreferred channel is entered into display memory 32 of the memory location associated with the channel during a channel programming mode initiated by the closure of a channel programming switch 78. To delete a channel during the channel programming mode, a user sequentially addresses the memory locations of memory 30 by the operation of CUP push button 38 or CDN push button 40 until the channel number of the channel to be deleted is displayed by channel number display 48, and then depresses a SKIP push button 80. In response to the depression of SKIP push button 80, an input bit complement 82, comprising eight "exclusive or" gates, inverts each of the binary signals of the binary word representing the channel number in the presently addressed memory location. It will be appreciated that when each bit of a binary word is complemented, the "1s" complement of that word is formed. For the reasons later explained, the "1s" complement of the binary words representing the channel numbers 2 through 83 are binary signals which represent illegal channel numbers.

If at a future date, the user wishes to reinstate a previously deleted channel because, for example, he has moved to a location where the reception characteristics and program content of the previously deleted channel are satisfactory, he again places tuning system 28 into its channel programming mode by closing channel programming switch 78 and selects the channel to be reinstated by means of CUP and CDN switches 38 and 40. When the channel number of the channel to be reinstated is displayed by channel number display 48, the user depresses SKIP push button 80 which enables input bit complementor 82 to form the "1s" complement of the binary word stored in display memory portion 32 of the presently addressed memory location. Since this binary word is the "1s" complement of the binary word representing the channel number of the previously deleted channel, when it is complemented again, the resulting binary word again represents the legal channel number of the associated channel.

The reason why the "1s" complements of binary words representing the legal channel numbers represent illegal channel numbers may be understood with reference to the following table showing the BCD representations and "1s" complements of the decimal numbers 0 through 9. Also shown are the BCD representations and "1s" complements of the hexadecimal states A, B, C, D, E and F which complete the BCD code having in all 16 different possibilities.

|   | BCD | | | | 1s Complement | | | |
|---|---|---|---|---|---|---|---|---|
|   | $2^3$ | $2^2$ | $2^1$ | $2^0$ | $2^3$ | $2^2$ | $2^1$ | $2^0$ |
| 0 | 0 | 0 | 0 | 0 | 1 | 1 | 1 | 1 |
| 1 | 0 | 0 | 0 | 1 | 1 | 1 | 1 | 0 |
| 2 | 0 | 0 | 1 | 0 | 1 | 1 | 0 | 1 |
| 3 | 0 | 0 | 1 | 1 | 1 | 1 | 0 | 0 |
| 4 | 0 | 1 | 0 | 0 | 1 | 0 | 1 | 1 |
| 5 | 0 | 1 | 0 | 1 | 1 | 0 | 1 | 0 |
| 6 | 0 | 1 | 1 | 0 | 1 | 0 | 0 | 1 |
| 7 | 0 | 1 | 1 | 1 | 1 | 0 | 0 | 0 |
| 8 | 1 | 0 | 0 | 0 | 0 | 1 | 1 | 1 |
| 9 | 1 | 0 | 0 | 1 | 0 | 1 | 1 | 0 |
| A | 1 | 0 | 1 | 0 | 0 | 1 | 0 | 1 |
| B | 1 | 0 | 1 | 1 | 0 | 1 | 0 | 0 |
| C | 1 | 1 | 0 | 0 | 0 | 0 | 1 | 1 |
| D | 1 | 1 | 0 | 1 | 0 | 0 | 1 | 0 |
| E | 1 | 1 | 1 | 0 | 0 | 0 | 0 | 1 |
| F | 1 | 1 | 1 | 1 | 0 | 0 | 0 | 0 |

For channel numbers having tens decimal digits greater than 7, i.e., for channel numbers having their tens decimal digit equal to 8, the units decimal digit a 0, 1, 2 or 3. When the BCD representations of 0, 1, 2 or 3 are complemented, the BCD representations of the hexadecimal states F, E, D and C, respectively, result. It will be noted that none of the units decimal digits of legal channel numbers are represented by the BCD representations of the hexadecimal states F, E, D and C.

For channel numbers having a tens decimal digit less than or equal to 7, the tens decimal digit must be a 1, 2, 3, 4, 5, 6 or 7. When the BCD representations of the numbers 1, 2, 3, 4 or 5 are complemented, the BCD representations of representations of the hexadecimal states F, E, D, C, B and A, respectively, result. It will be noted that none of the tens decimal digits of legal channel numbers are represented by the BCD representations of the hexadecimal states F, E, D, C, B and A. When The BCD representations of 6 and 7 are complemented, the BCD representations of the decimal numbers 9 and 8, respectively, result. Since there are no legal channel numbers above 83, there are no legal channel numbers represented by the BCD representation for the decimal number 9. Therefore, only channel numbers between 80 and 83 can result by complementing the BCD representations of a channel number having a tens decimal digit less than or equal to 7. However, for a BCD representation for a channel number between 80 and 83, having units decimal digits 0, 1, 2 or 3, to result from complementing a legal channel number, the units digit must have been represented by the BCD representations of the hexadecimal states F, E, D or C, respectively, and none of the units decimal digits of legal channel numbers are represented by the BCD representations of the hexadecimal states F, E, D, or C.

During the normal channel selection mode, when channel programming switch 78 is opened, as a user depresses CUP channel selection pushbutton 38 or CDN channel selection pushbutton 40 to sequentially address the memory locations of memory 30, binary words representing illegal channel numbers are detected by an illegal channel number detector 84, which, for example, may comprise an ROM (Read Only Memory) for generating an illegal signal when the binary signals coupled to it do not represent legal channel numbers, such as disclosed in U.S. Pat. No. 4,024,476 issued in the name of G.R. Briggs on May 17, 1977, hereby incorporated by reference. In response to the detection of an illegal channel number an ILLEGAL signal is generated. The ILLEGAL signal is coupled through an "and" gate 86, enabled by virtue of the open contacts of channel programming switch 78, and through and "or" gate 85 to the CK (CLocK) input of address counter 36 to increase or decrease its count (depending on whether CUP pushbutton 38 or CDN pushbutton 40 has been depressed). As a result, illegal channel numbers represented by the storage of an illegal channel number in the corresponding location of the display memory 32 of memory 30 will automatically be skipped. Furthermore, so that an unmeaningful display is not produced when a memory location corresponding to a nonpreferred channel is addressed, the ILLEGAL signal is coupled to display unit 48 to blank the display during the channel skipping operation. The ILLEGAL signal is also coupled to band decoder 54 so that local oscillator 16 is disabled during the channel skipping operation.

Since, during the channel programming mode, it is desired that a user be able to select all the channels, whether previously skipped or not, due to the closure of channel programming switch 78, "and" gate 86 is disabled from coupling the ILLEGAL signal to the CK input of address counter 36 when an illegal channel number is detected. As a result, each memory location is addressed whether it has been previously skipped or not. Furthermore, so that the channel numbers and tuning voltages of all the channels, whether previously skipped or not, are generated during the channel programming mode, an output complementor 88, comprising eitht "exclusive or" gates, is coupled between the output of the portion of memory 30 for storing the binary words representing the channel numbers and channel number display unit 44 and band decoder 64 to individually complement the binary signals of a binary word stored in display memory 32 of a presently addressed memory location in response to the generation of an ILLEGAL signal by illegal channel number detector 84. Furthermore to this end, during the channel programming mode and the disabling of "and" gate 86 as previously described, the ILLEGAL channel signal is not coupled to display unit 48 and bandswitching detector 54 so that they are not rendered inoperative in response to the detection of an illegal channel number is the case in the normal channel selection mode.

Thus, it is seen that the channel skipping apparatus of tuning system 28 for deleting a nonpreferred channel comprising input complementor 82 for individually complementing all of the binary signals of a binary word representing, in BCD format, a channel number of a selected channel, not only utilizes the existing display memory portion 32 of the memory location associated with the nonpreferred channel for storing channel skipping information thereby obviating a separate memory or memory portion for this purpose, but also operates in a manner whereby the binary signals representing the channel number of the nonpreferred channel are not eradicated so that they may readily be recalled at a later time when it is desired to reinstate the nonpreferred channel.

While the present channel skipping apparatus has been described in terms of a tuning system including memory for storing information for each of the channels in the television broadcast range, it will be appreciated that the present channel skipping apparatus is also useful in a tuning system, such as disclosed, for example, in the "Magnavox Service Manual, Manual No. 7353, file Volume 12, Television Section, for the 703777 Videomatic Touch Tune Assembly," published by the Magnavox Company, Fort Wayne, Indiana, in which a memory is provided for storing information for only a limited number of the channels available in the television band. In these systems, as earlier described, at least some programming will be left for the user and for this purpose, the empty memory locations in the memory will be programmed by the manufacturer to contain all "0s" or all "1s" until a user programs them for the channels he desires. Since binary words consisting of all "0s" and all "1s" stored in a display memory portion represent illegal channel numbers, it will be appreciated that the present channel skipping apparatus will cause unprogrammed memory locations to be automatically skipped and therefore will be consistent with the operation of tuning systems including a memory for storing tuning information for only a limited number of channels. Moreover, while input complementor 82 and output complementor 88 have been described as consisting of "exclusive or" gates, it will be appreciated that tuning systems employing a microproseccor for controlling the operation of the tuning system may perform the complementing operations as part of a program subroutine. These and other modifications to the present tuning system are contemplated to be within the scope of the present invention as recited in the following claims.

What is claimed is:

1. A tuning system for tuning a receiver to receive radio frequency carriers associated with various tuning positions in a predetermined range of tuning positions available for selection by a user, comprising:

memory means including a plurality of memory locations for storing binary words consisting of respective groups of binary signals, display binary words consisting of groups of binary signals arranged in coded formats to represent respective ones of said tuning positions being normally stored in said memory locations, each of said memory locations being identified by an address;

tuning position selection means for generating address signals representing the address of the memory location associated with a presently selected tuning position;

tuning position display means for displaying symbols representing said tuning positions in response to the display binary word stored in a presently addressed memory location;

input means for selectively complementing each of the binary signals included in the binary word stored in a presently addressed memory location to form a resulting binary word, resulting binary words formed by complementing all the binary signals included in a display binary word representing illegal tuning positions not in said predetermined range; and detector means for generating an illegal signal when the binary word stored in a presently addressed memory location represents an illegal tuning position;

said tuning position selection means generating address signal representing the address of the memory location associated with the tuning position next in succession to said presently selected tuning position in response to said illegal signal.

2. The apparatus recited in claim 1 further including output means coupled between said display memory means and said tuning position display means for complementing each of the binary signals included in the binary word stored in a presently addressed memory location solely in response to said illegal signal; and tuning position programming means for selectively inhibiting said tuning position selection means to respond to said illegal signal.

3. The apparatus recited in claim 2 wherein said input means includes tuning position skipping means for selectively generating a skip signal in response to user control and a plurality of "exclusive or" gates each for complementing a respective binary signal included in the binary word stored in a presently addressed memory location solely in response to said skip signal; and said input means includes a plurality of "exclusive or" gates each for complementing a respective binary signal included in the binary word stored in a presently addressed memory location solely in response to said illegal signal.

4. The apparatus recited in claim 2 wherein said tuning positions are identified by channel numbers between 2 and 83; and said display binary words each consist of a first group of four binary signals arranged in binary coded decimal format to represent the units decimal digit of an associated channel number and a second group of four binary signals arranged in binary coded decimal format to represent the tens decimal digit of the associated channel number.

* * * * *